US012571825B2

(12) United States Patent
Mirjanic et al.

(10) Patent No.: US 12,571,825 B2
(45) Date of Patent: Mar. 10, 2026

(54) WEARABLE ELECTRIC FIELD DETECTOR

(71) Applicant: Emerson Professional Tools, LLC, Elyria, OH (US)

(72) Inventors: Kristofer Mirjanic, Elburn, IL (US); Madelyn M. Bauer, Cleveland, OH (US); Greg Sassi, Machesney Park, IL (US)

(73) Assignee: Emerson Professional Tools, LLC, Elyria, OH (US)

( * ) Notice: Subject to any disclaimer, the term of this patent is extended or adjusted under 35 U.S.C. 154(b) by 161 days.

(21) Appl. No.: 18/484,959

(22) Filed: Oct. 11, 2023

(65) Prior Publication Data

US 2025/0035690 A1     Jan. 30, 2025

Related U.S. Application Data

(60) Provisional application No. 63/515,546, filed on Jul. 25, 2023.

(51) Int. Cl.
*G01R 29/08* (2006.01)
*G08B 5/36* (2006.01)

(52) U.S. Cl.
CPC ............ *G01R 29/0857* (2013.01); *G08B 5/36* (2013.01)

(58) Field of Classification Search
CPC .............................. G01R 29/0857; G08B 5/36
USPC ......................................................... 324/156
See application file for complete search history.

(56) References Cited

U.S. PATENT DOCUMENTS

| | | | |
|---|---|---|---|
| 5,168,265 A | 12/1992 | Aslan | |
| 6,788,215 B1 | 9/2004 | White | |
| 7,549,763 B2 * | 6/2009 | Kim | A42B 3/044 |
| | | | 362/396 |
| 9,658,265 B2 | 5/2017 | Hoffman et al. | |

(Continued)

FOREIGN PATENT DOCUMENTS

| | | |
|---|---|---|
| CN | 107518487 A | 12/2017 |
| CN | 107647516 A | 2/2018 |
| CN | 219780645 U | 9/2023 |

OTHER PUBLICATIONS

Safeguard, Compass Pro, https://www.safeguardequipment.com/ipmag/compass-pro/, copyright 2018.

(Continued)

*Primary Examiner* — Stephanie E Bloss
*Assistant Examiner* — Michael A Harrison
(74) *Attorney, Agent, or Firm* — Klintworth & Rozenblat LLP

(57) ABSTRACT

A wearable electric field detector is configured to detect an electric field generated by a high-voltage electrical source in an environment, and includes a housing providing a cavity in which electrical components are provided, an indicator operatively coupled to the electrical components and configured to provide an alert to the wearer indicative of a strength of a detected electric field, and a spring-biased clip coupled to the housing by a pivotal connection. The clip includes a first arm section which overlays a top wall of the housing, and a second arm section which overlays a front wall of the housing. At least one pin is mounted within a bore in the housing, and a spring within the bore biases the pin outward from the housing and into contact with the second arm section of the clip.

20 Claims, 8 Drawing Sheets

(56) References Cited

U.S. PATENT DOCUMENTS

| | | | |
|---|---|---|---|
| D792,252 S | 7/2017 | Garner | |
| 10,091,897 B2 | 10/2018 | Filson et al. | |
| 10,802,065 B2 | 10/2020 | Mcnulty et al. | |
| 10,877,081 B2 | 12/2020 | Mcnulty et al. | |
| 10,891,848 B2 | 1/2021 | Mcnulty et al. | |
| 2018/0164350 A1* | 6/2018 | Thompson | G01R 15/16 |
| 2020/0093981 A1* | 3/2020 | Rau | A61M 5/3202 |
| 2021/0270873 A1 | 9/2021 | Thompson et al. | |

OTHER PUBLICATIONS

Compass Pro product https://web.archive.org/web/20221027130257/
https://www.safeguardequipment.com/wp-content/uploads/2022/10/
COMPASS-PRO-Product-Specs-White-Paper.pdf Wayback machine
capture Oct. 27, 2022 of the undated whitepaper.
Compass product User guide dated May 31, 2022.

* cited by examiner

WEARABLE ELECTRIC FIELD DETECTOR

PRIOR APPLICATION

This application claims the benefit of U.S. Provisional Application No. 63/515,546 filed Jul. 25, 2023, the disclosure of which is incorporated herein by reference.

FIELD OF THE DISCLOSURE

The present disclosure generally relates to a wearable electric field detector that warns the wearer of proximity to nearby high-voltage conductors.

BACKGROUND

Reliably detecting high-voltages on distribution and transmission power lines is critical to the jobs performed by electric utility line workers. When these jobs are performed, an electric field detector adds additional safety and is also convenient and easy to use.

It is known to wear a detector, which detector may be secured about the wearer's neck by a lanyard for convenience. However, such known detectors are designed to properly detect electric fields only when worn in a vertical position. Such known detectors lose sensitivity and accuracy if not worn in the vertical position.

BRIEF DESCRIPTION OF THE DRAWINGS

The system may be better understood with reference to the following drawings and the description. The components in the figures are not necessarily to scale, emphasis instead being placed upon illustrating the principles disclosed. Moreover, in the figures, like-referenced numerals designate corresponding parts throughout the different views.

DETAILED DESCRIPTION

Figure 1:
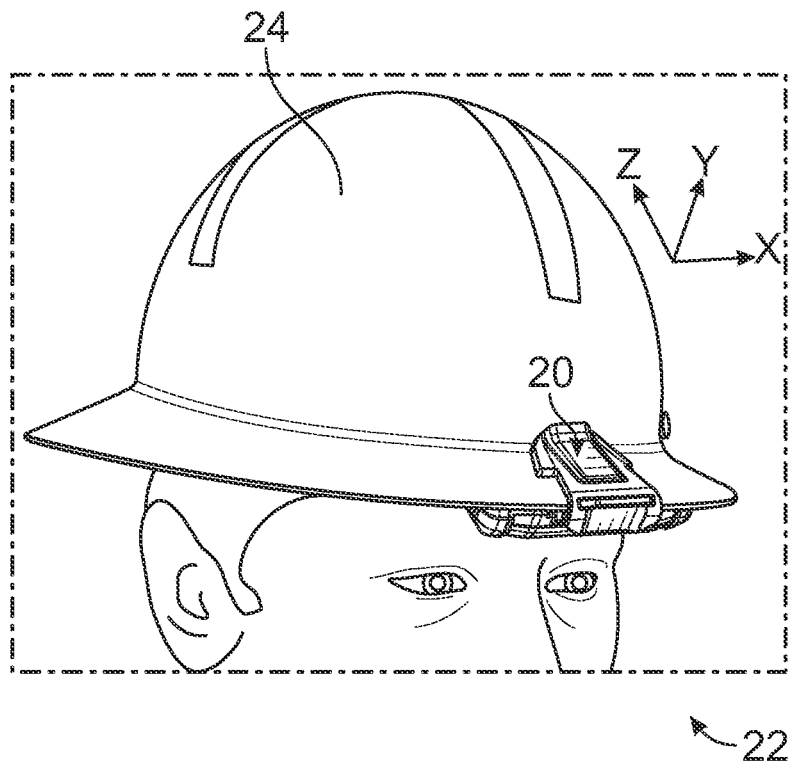
FIG. 1 depicts an electric field detector worn in a hard hat mounted orientation.

While the disclosure may be susceptible to embodiment in different forms, there is shown in the drawings, and herein will be described in detail, a specific embodiment with the understanding that the present disclosure is to be considered an exemplification of the principles of the disclosure, and is not intended to limit the disclosure to that as illustrated and described herein. Therefore, unless otherwise noted, features disclosed herein may be combined together to form additional combinations that were not otherwise shown for purposes of brevity. It will be further appreciated that in some embodiments, one or more elements illustrated by way of example in a drawing(s) may be eliminated and/or substituted with alternative elements within the scope of the disclosure.

In the present description, it should be noted that the terms "top", "bottom", "front", "rear", "left", "right", "vertical", "horizontal" and the like indicate orientations or positional relationships based on the orientations or positional relationships shown in FIG. 1 of the drawings, merely to facilitate description of the present disclosure and simplify the description, and do not indicate or imply that the apparatus or elements referred to must have a specific orientation, be configured and operated in a specific orientation, and thus should not be construed as limiting the present invention.

The present disclosure relates to electric field detection, and more particularly to a wearable electric field detector 20 configured to detect such electric fields, which are typically high-voltage electric fields. The wearable electric field detector 20 provides an early warning to the wearer of the proximity to nearby high-voltage conductors that generate the electric field. In some embodiments, the high-voltage conductors are alternating current (AC) conductors, thus high-voltage AC electric fields are generated.

Figure 2:
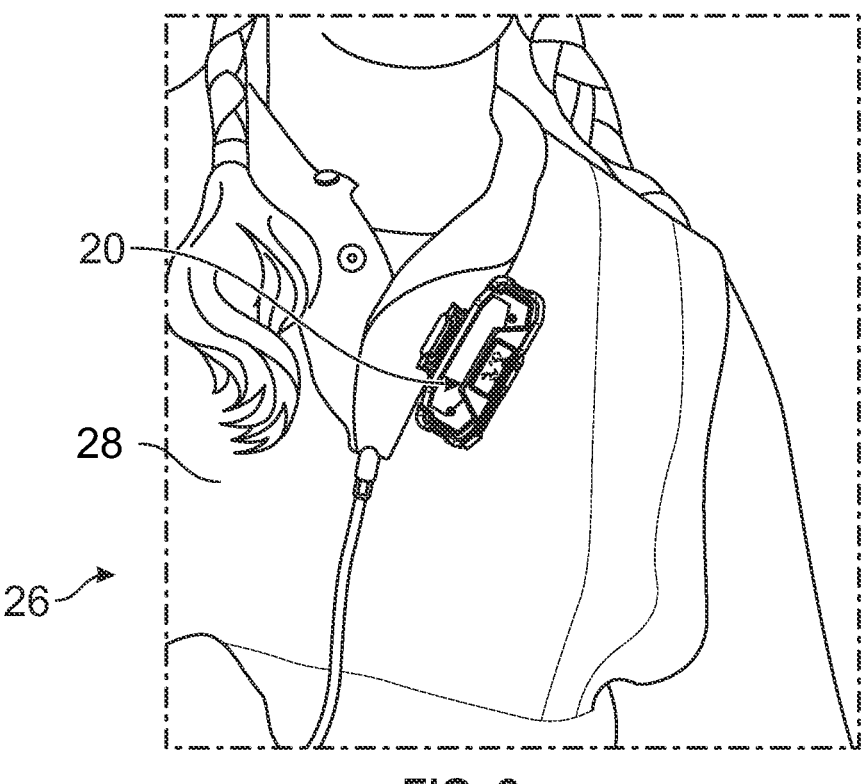
FIG. 2 depicts the electric field detector worn in a torso-mounted orientation.

FIG. 1 shows an embodiment of the present disclosure that permits a wearer to removably wear the electric field detector 20 in a generally horizontal orientation 22 clipped to or otherwise fastened to a hard hat 24. When viewed from a front of the electric field detector 20 as shown in FIG. 1, the horizontal falls along an x-axis direction, the vertical falls along a y-axis direction and an insertion direction of the electric field detector 20 onto the hard hat 24 and removal therefrom fall along a z-direction. Another possible orientation is shown in FIG. 2 in which the wearer wears the electric field detector 20 in orientation disposed angularly between the vertical orientation and the horizontal orientation 26, where the electric field detector 20 may also be clipped to an article of clothing 28. The wearing of the electric field detector 20 in a generally horizontal orientation 22 is the preferred positioning because this positioning enables the most functionality.

Figure 3:
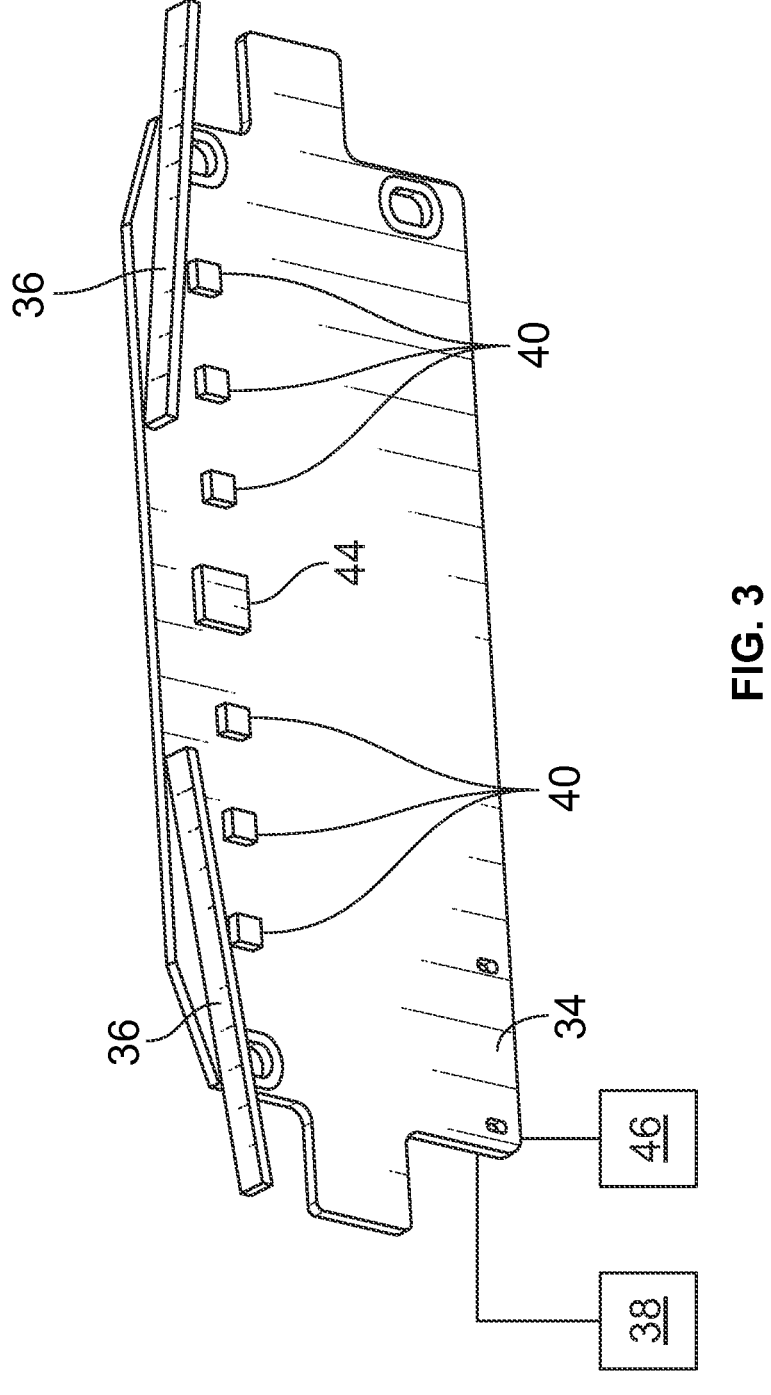
FIG. 3 depicts a printed circuit board, with a first antenna and a second antenna of the electric field detector.
Figure 4:
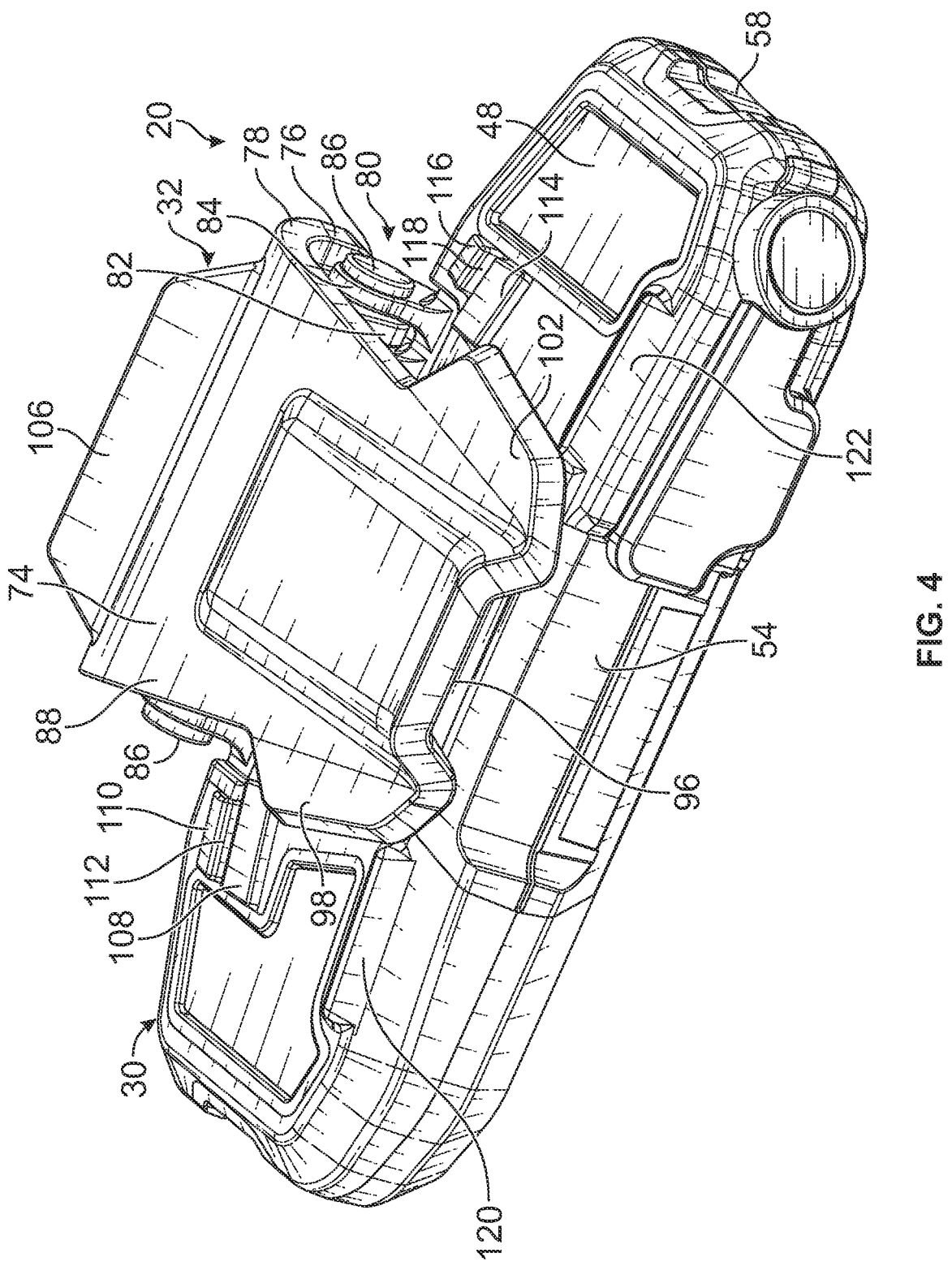
FIG. 4 depicts a rear, top perspective view of the electric field detector.
Figure 11:
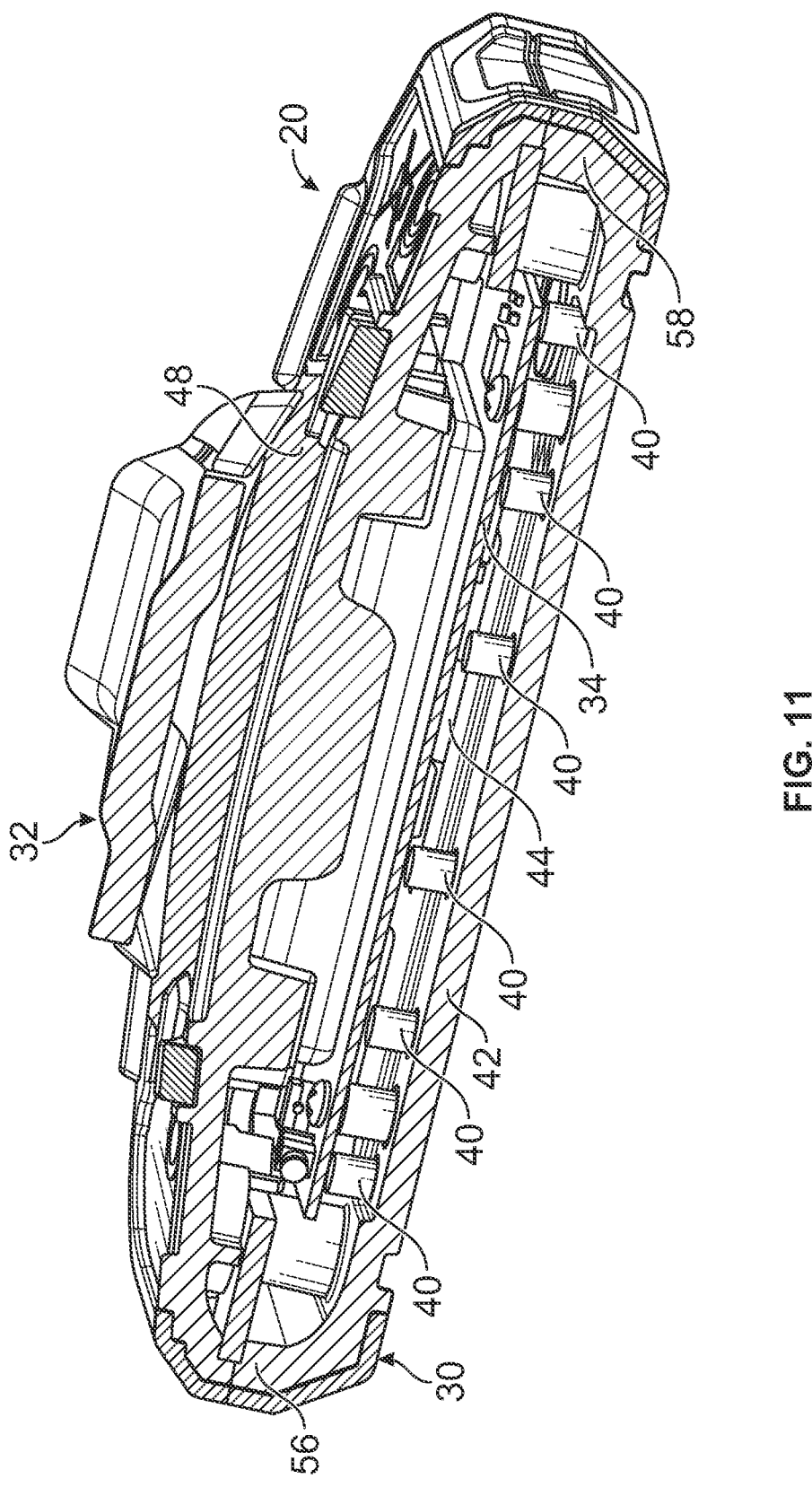
FIG. 11 depicts another cross-sectional view of the electric field detector.

FIG. 4 shows an electric field detector 20 having a housing or plastic shell 30 and a spring-loaded clip 32 thereon which permits attachment to the brim of the hard hat 24 or to the clothing 28. The housing or plastic shell 30 fixedly mounts components which provide for operation of the electric field detector 20. Such an example of the components are disclosed in U.S. patent application Ser. No. 18/315,613 which is concurrently owned by the Assignee herein and is incorporated by reference in its entirety. Such components may include a printed circuit board 34, and first and second spaced apart antennas 36, see FIG. 3. Each antenna 36 may detect a slightly different electrical field strength which may provide directionality of the detected electric field based on the measured signal strength at each respective antenna 36. A power source 38, such as a battery, provides power to the printed circuit board 34 to power the various electrical components. Further, an indicator, such as plurality of LEDs 40 visible to the wearer through a translucent portion 42 of the housing or plastic shell 30 or an audio output device 44 such as an audio transducer or speaker configured to produce an audio warning tone or series of sounds to the wearer, may be operatively coupled to the printed circuit board 34, which may be configured to provide an alert to the wearer indicative of a strength of a detected electric field and/or proximity thereto. When the LEDs 40 are mounted on the printed circuit board 34, the light from the LEDs 40 passes through light pipes 40', see FIG. 11, which extend from the translucent portion 42 of the housing or plastic shell 30 toward the printed circuit board 34. To convey directionality of the electrical field generally relative to the wearer, the LEDs 40 may be illuminated sequentially and periodically to give the illusion of movement of the LEDs 40 in a particular direction. This may provide the wearer with an indication, either leftward of the wearer, or rightward of the wearer, of the location of the detected electric field. The volume, frequency, or repetition rate of the audio output device may provide the wearer with an indication of the proximity to or the strength of the detected electrical field. The audio transducer may beep at a first rate when the detected electric field exceeds a first threshold. Then, when the electric field exceeds a second threshold, the audio transducer may beep at a second rate, which is greater than the first rate. Further, when the electric field exceeds a third threshold, the audio transducer may beep at a third rate, which is greater than the second rate. This provides a stepped level of alerts to indicated a progressively stronger detected electric field. The LEDs 40 may also be capable of indicating field strength and proximity in addition to directionality. There may be the same three thresholds for the electric field with corresponding LED blinking rates as well as the number of illuminated LEDs 40. In other words, when the measured electric field strength increases, the LEDs 40 blink faster and the sound beeps faster indicating that the electric field detector 20 is in closer proximity to the source of the electric field. A microprocessor or other general purpose controller 46 provides control and operation of the electric field detector 20, including input/output functions for the indicators 40, 44.

The housing or plastic shell 30 is described from the perspective of the electric field detector 20 being worn on the hard hat 24 of the wearer or convenience in description only. The housing or plastic shell 30 has a generally planar top wall 48, an opposite bottom wall 50, a front wall 52, an opposite rear wall 54, a first side wall 56 (which is closest to the left hand of the wearer when worn on the hard hat 24) extending between the walls 48, 50, 52, 54, and a second side wall 58 (which is closest to the right hand of the wearer when worn on the hard hat 24) extending between the walls 48, 50, 52, 54. An internal cavity 62 is formed within the walls 48-58 in which the printed circuit board 34 and the components provided thereon, the power source 38 and the controller 46 are positioned. The translucent portion 42 of the housing or plastic shell 30 is provided through the bottom wall 50 to allow light from the LEDs 40 to shine through the light pipes 40' and visible from outside the housing or plastic shell 30. The bottom wall 50 also has an opening 60 which allows for sound to pass therethrough from the audio output device 44.

Figure 5:
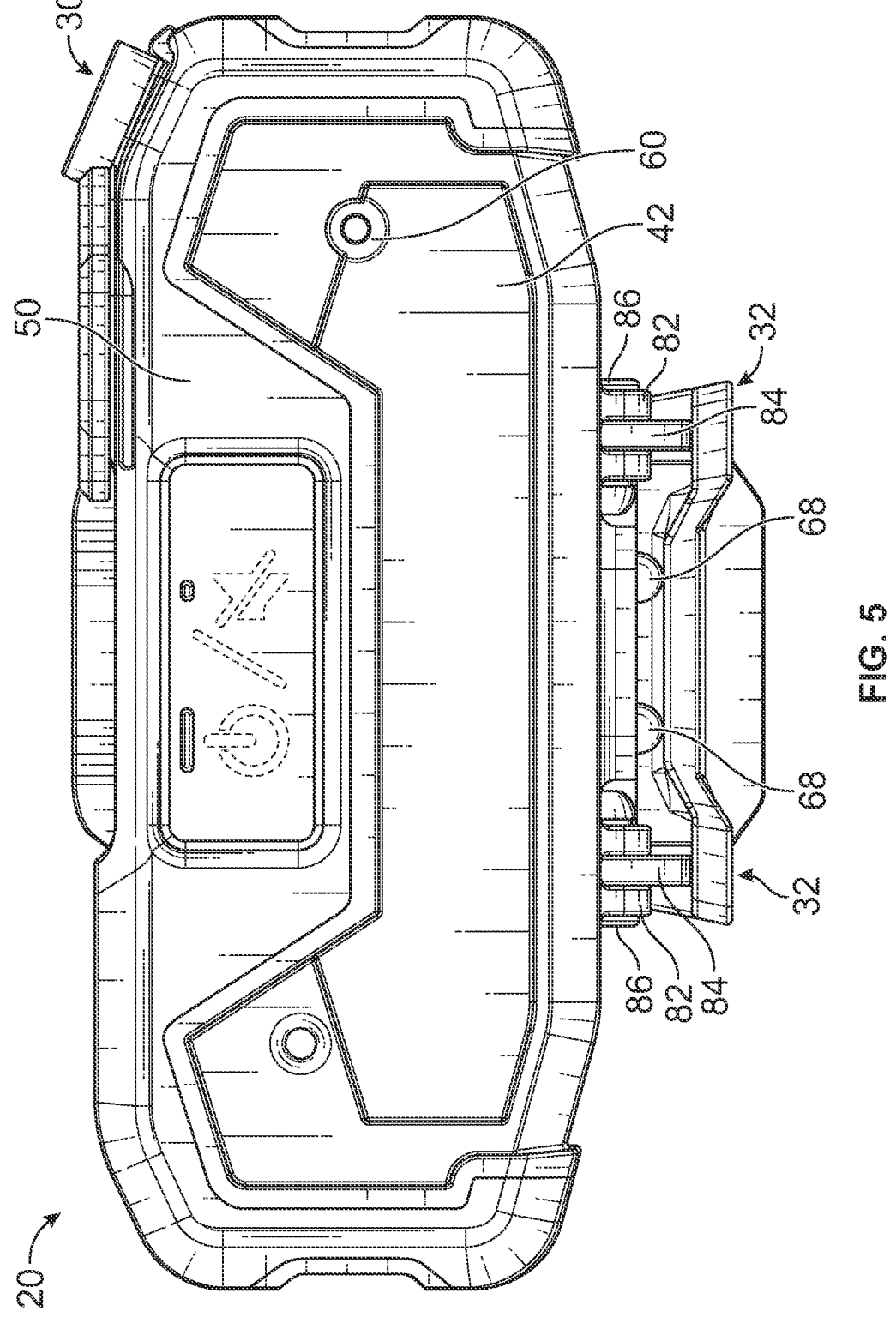
FIG. 5 depicts a bottom plan view of the electric field detector.
Figure 6:
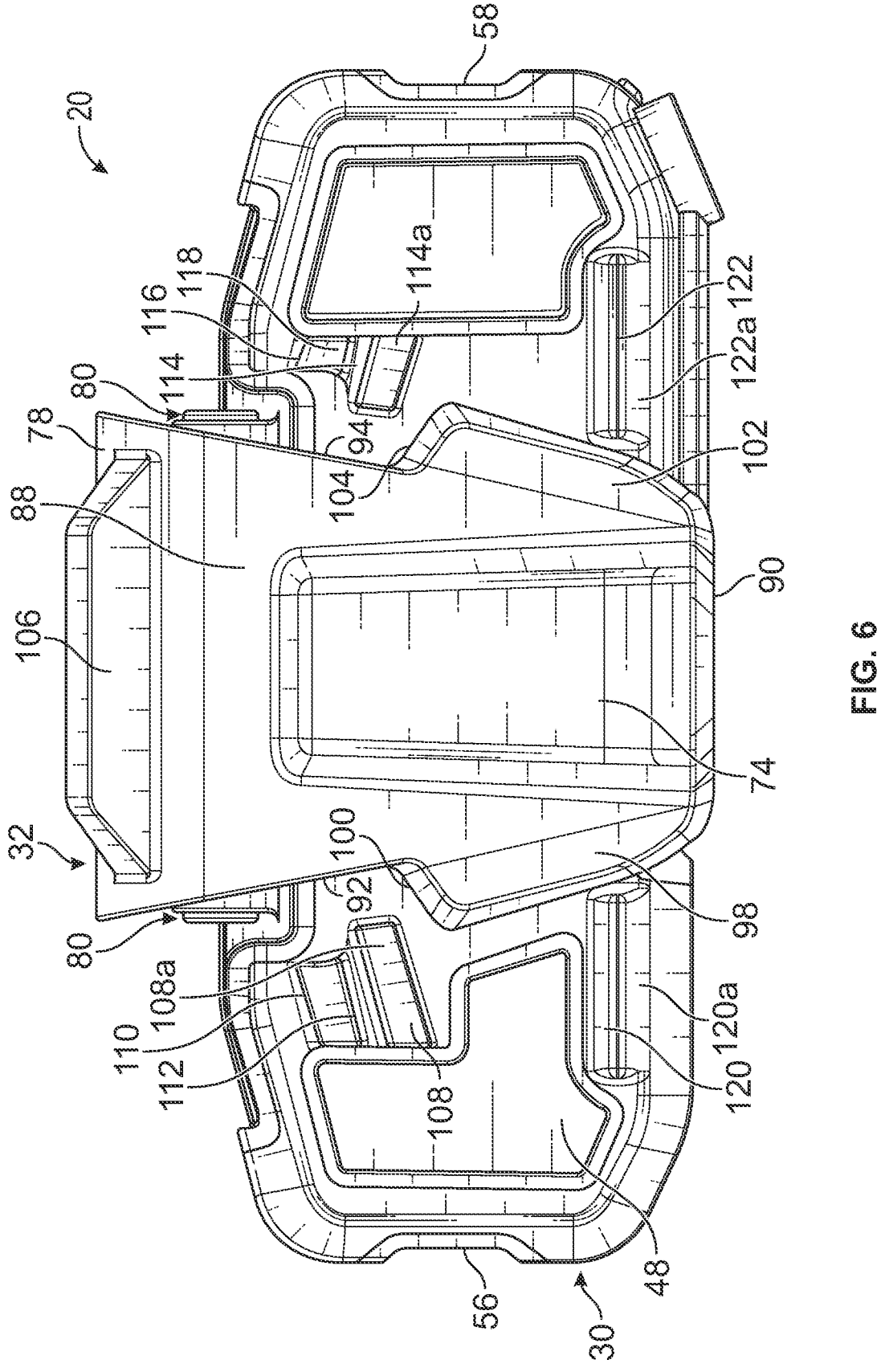
FIG. 6 depicts a top plan view of the electric field detector.
Figure 7:
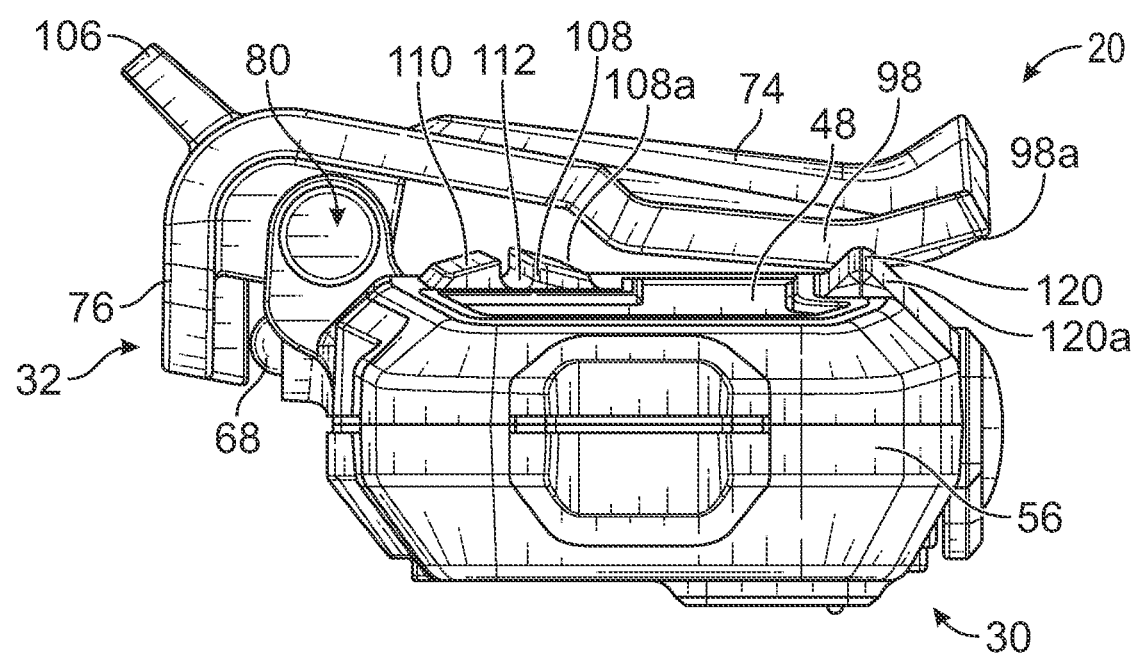
FIGS. 7 and 8 depict side elevation views of the electric field detector.
Figure 8:
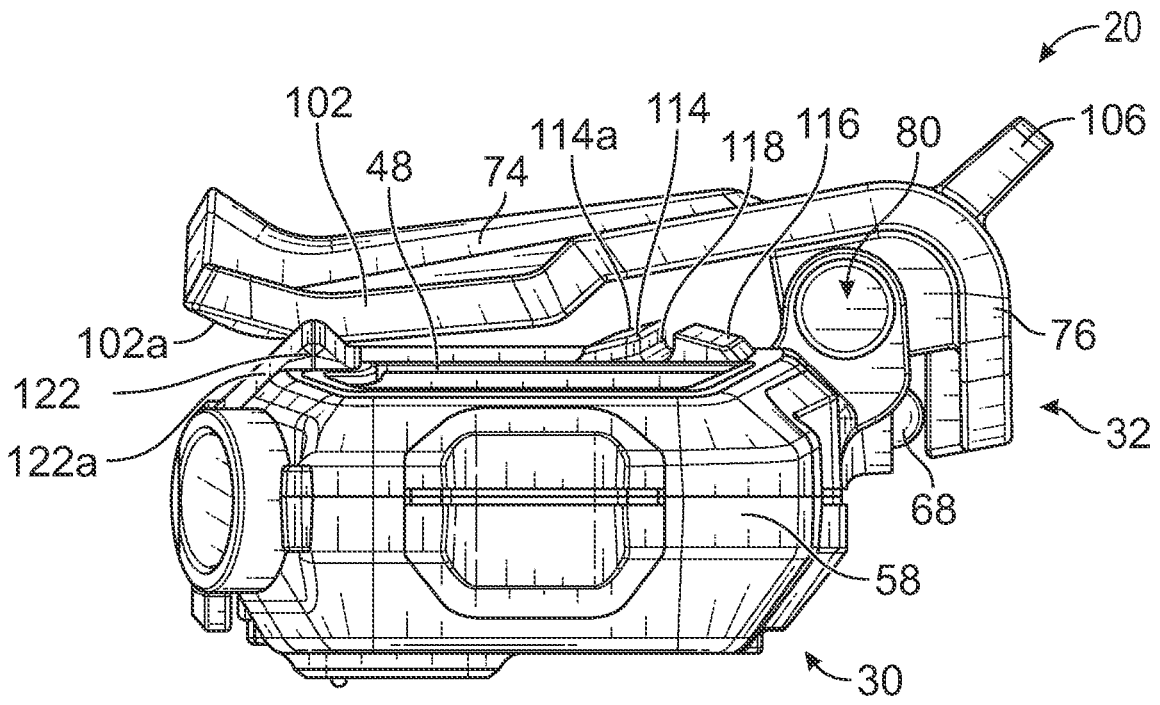
Figure 9:
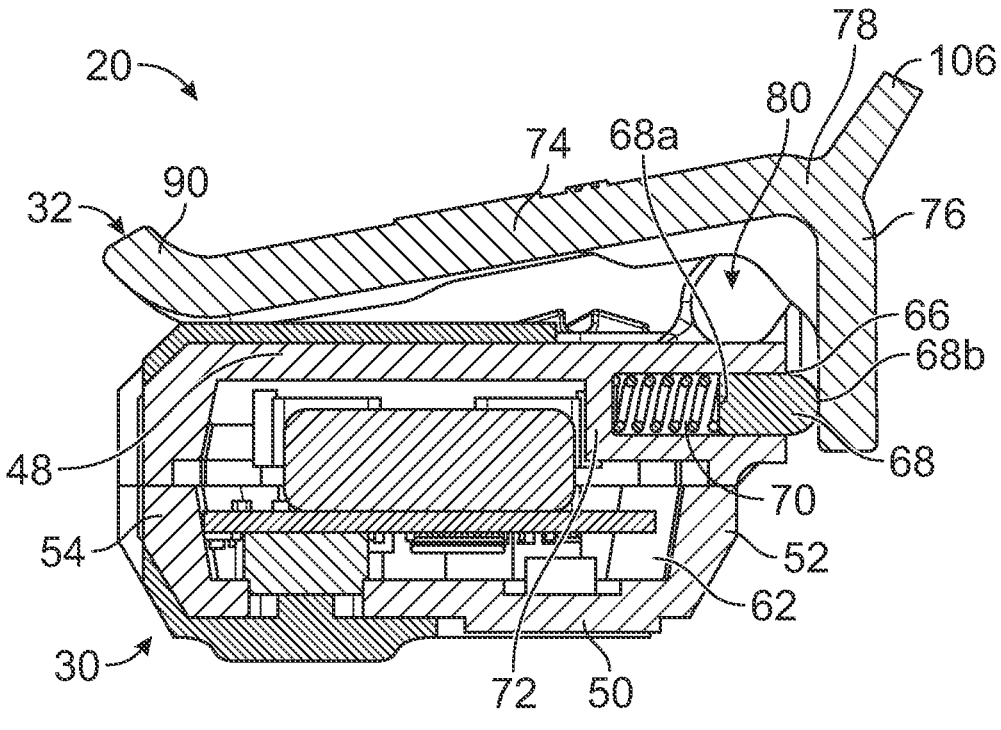
FIG. 9 depicts a cross-sectional view of the electric field detector with a clip thereof in a closed position.
Figure 10:
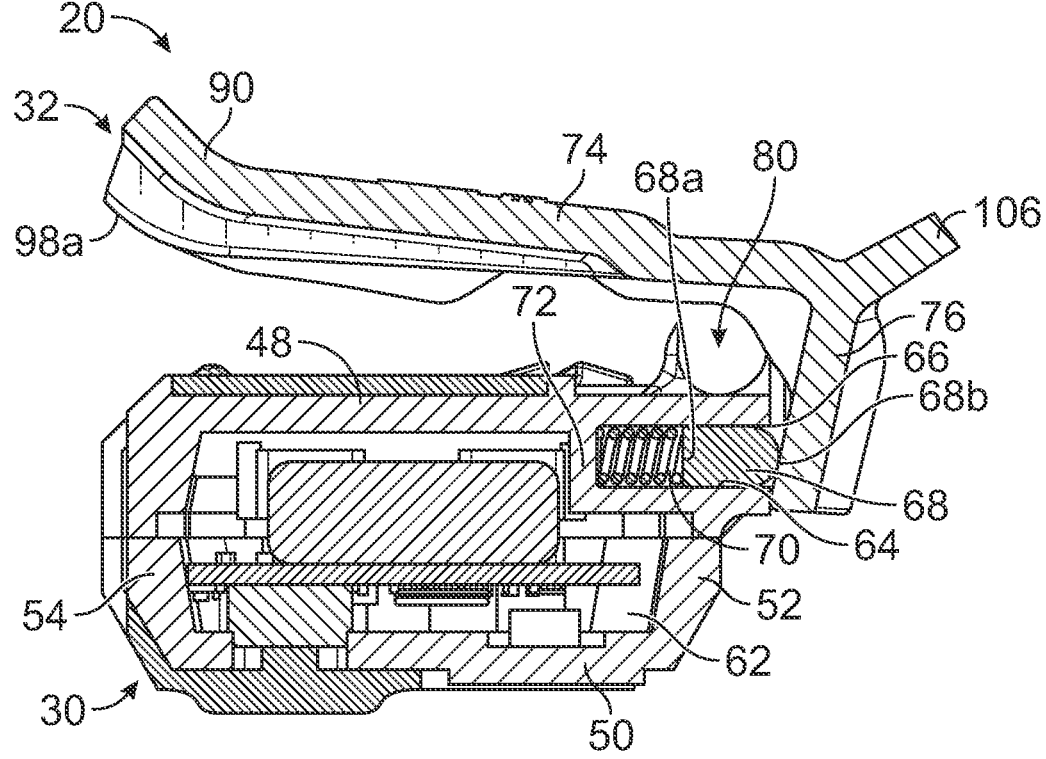
FIG. 10 depicts a cross-sectional view of the electric field detector with the clip thereof in an open position.

A pair of spaced apart blind bores 64 extend from front openings 66 in the front wall 52 and are separated from the cavity 62. The bores 64 are proximate to the top wall 48 and extend toward the rear wall 54. A pin 68 is positioned within each bore 64 and extends outward from the opening 66 under bias from a spring 70 positioned between a rear wall portion 72 of the respective blind bore 64 and a rear end 68a of the pin 68. The springs 70 may be coil springs. The bores 64 and pins 68 are spaced apart from each other, as shown in FIG. 5.

The clip 32 is generally L-shaped and has a first arm section 74 and a second arm section 76 which is generally perpendicular to the first arm section 74 which meet at an elbow 78. The first arm section 74 extends over the top wall 48 and the second arm section 76 extends over the front wall 52 and covers, and engages with, front ends 68b of the pins 68. The clip 32 is pivotally coupled to the top wall 48 by first and second freely pivotal couplings 80 which may be sets of interlocking ears 82, 84 on the clip 32 and the top wall 48 with pivot pins 86 extending therethrough. Other pivotal couplings are within the scope of the present disclosure.

The first arm section 74 has a generally planar section 88 having a free end 90 opposite the elbow 78 and sides 92, 94 extending between the free end 90 and the elbow 78. An underside surface of the free end 90 curves upwardly. The sides 92, 94 may angle outward from the free end 90 to the elbow 78. The first arm section 74 provides engagement regions for a wearer to engage his/her hand therewith. A first engagement region is provided by a wall 96 forming a recess on an underside of the first arm section 74 is provided and extends from the free end 90 of the first arm section 74 toward the elbow 78. The recess formed by the wall 96 does not extend across the entire length of the first arm section 74 which is defined between the sides 92, 94. A wearer can insert their fingers into the recess formed by the wall 96. A second engagement region is provided by a wall 106 projecting outward from, and forward from, the first arm section 74 proximate to the elbow 78. A wearer can grasp this wall 106 as described herein.

A wing 98 extends from side 92 starting at the free end 90 and ends at a front end 100, and a wing 102 extends from side 94 and starts at the free end 90 and ending at a front end 104. The front ends 100, 104 are spaced from the respective pivotal couplings 80 such that spaces are provided therebetween. An underside surface 98a, 102a is curved.

The top wall 48 has a first pair of projections 108, 110 extending upwardly therefrom which are provided proximate to, but spaced from, the first pivotal coupling 80, and to the side of the clip 32. The projections 108, 110 are between the first arm section 74 and the side wall 56. The projections 108, 110 are spaced apart from each other, with the projection 108 being rearward of the projection 110. The projections 108, 110 generally extend transverse to a width of the first arm section 74 of the clip 32 which is defined between the front and rear walls 52, 54. Each projection 108, 110 may be curved such that a curved groove 112 is provided between the projections 108, 110. The rearward projection 108 may have a rearward surface 108a which is angled relative to the top wall 48 which acts as a ramp. The top wall 48 has a second pair of projections 114, 116 extending upwardly therefrom which are provided proximate to, but spaced from, the second pivotal coupling 80, and to the other side of the clip 32. The projections 114, 116 are between the first arm section 74 and the side wall 58. The projections 114, 116 are spaced apart from each other, with the projection 114 being rearward of the projection 116. The projections 114, 116 generally extend transverse to the width of the first arm section 74 of the clip 32. Each projection 114, 116 may be curved such that a curved groove 118 is provided between the projections 114, 116. The rearward projection 114 may have a rearward surface 114a which is angled relative to the top wall 48 which acts as a ramp. The grooves 112, 118 preferably fall along the same radial line. The projections 108, 110, 114, 116 are forward of the front ends 100, 104. While two separate and spaced apart sets of projections 108, 110, 114, 116 are described and shown, a single set of projections defining a single groove could instead be provided.

The top wall 48 has a third projection 120 extending upwardly therefrom which is provided proximate to, but spaced from, the rear wall 54, and to the side of the wing 98. The projection 120 is between the wing 98 and the side wall 56. The projection 120 generally extends transverse to the width of the first arm section 74 of the clip 32. The projection 120 may be linear and have a rearward surface 120*a* which is angled relative to the top wall 48 which acts as a ramp. The top wall 48 has a fourth projection 122 extending upwardly therefrom which is provided proximate to, but spaced from, the rear wall 54, and to the other side of the clip 32. The projection 122 is between the wing 102 and the side wall 58. The projection 122 generally extends transverse to the width of the first arm section 74 of the clip 32. The projection 122 may be linear and have a rearward surface 122*a* which is angled relative to the top wall 48 which acts as a ramp. The projections 120, 122 preferably align with each other.

The pins 68 are biased outward from the housing or plastic shell 30 by the springs 70 and into engagement with the second arm section 76. This causes the first arm section 74 to move toward the top wall 48 of the housing or plastic shell 30. This biasing force can be overcome in several ways. First, a wearer can grasp the free end 90 of the first arm section 74 (the wearer can insert their fingers into the recess formed by the wall 96) and pivot the clip 32 around the pivotal coupling 80. Second, the wearer can grasp the wall 106 and pivot the clip 32 around the pivotal coupling 80. Third, the wearer can push the electric field detector 20 onto the brim of the hard hat 24 during which the front edge of the brim will engage with the ramped surfaces 98*a*, 102*a*, 120*a*, 122*a* which will cause the first arm section 74 to move upward and cause the clip 32 to pivot around the pivotal coupling 80. Each of these ways will cause the pins 68 to be pushed into the bores 64 and compress the springs 70 (the springs 70 preferably do not fully compress).

When the first arm section 74 is released, the springs 70 expand which causes the pins 68 to push the second arm section 76 and rotate the clip 32 around the pivotal coupling 80 such that the first arm section 74 moves toward the top wall 48. The hard hat 24 or clothing 28 is easily accommodated between the first arm section 74 and the top wall 48 with the springs 70 providing sufficient force to maintain the clip 32 in the closed position (or a gripped position). When the brim of the hard hat 24 is between the first arm section 74 and the top wall 48, a curved lip on the underside of the brim of the hard hat 24 seats within the grooves 112, 118. This assists in attaching the electric field detector 20 to the hard hat 24.

While two spring-loaded pins 68 are shown and described, a single spring-loaded pin or more than two spring-loaded pins can be provided.

A rubber coating can be provided on the outside of the housing or plastic shell 30 to allow a wearer to more easily grasp the electric field detector 20.

FIGS. 12-19 show the ornamental features of the electric field detector 20 in solid line. Components which are shown in broken line do not comprise parts of the ornamental features.

Many modifications and other embodiments of the disclosure set forth herein will come to mind to one skilled in the art to which these disclosed embodiments pertain having the benefit of the teachings presented in the foregoing descriptions and the associated drawings. Therefore, it is to be understood that the disclosure is not to be limited to the specific embodiments disclosed herein and that modifications and other embodiments are intended to be included within the scope of the disclosure. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the disclosure. In this regard, for example, different combinations of elements and/or functions than those explicitly described above are also contemplated within the scope of the disclosure. Although specific terms are employed herein, they are used in a generic and descriptive sense only and not for purposes of limitation.

While particular embodiments are illustrated in and described with respect to the drawings, it is envisioned that those skilled in the art may devise various modifications without departing from the spirit and scope of the appended claims. It will therefore be appreciated that the scope of the disclosure and the appended claims is not limited to the specific embodiments illustrated in and discussed with respect to the drawings and that modifications and other embodiments are intended to be included within the scope of the disclosure and appended drawings. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the disclosure and the appended claims.

What is claimed is:

1. A wearable electric field detector configured to detect an electric field generated by a high-voltage electric source in an environment, the wearable electric field detector comprising:

a housing providing a cavity in which electrical components are provided, the housing further having a blind bore having a closed end and an opposite open end which is open to an outer surface of the housing;

an indicator operatively coupled to the electrical components and configured to provide an alert to a wearer indicative of a strength of a detected electric field;

a clip coupled to the housing by a pivotal connection, the clip including a first arm section which overlays a top wall of the housing and a second arm section which overlays a front wall of the housing, the first and second arm sections being coupled together at an elbow, each arm section having a free end opposite to the elbow;

a pin mounted within the blind bore in the housing and configured extend through the open end of the blind bore to be directly engaged with the second arm section; and a spring within the blind bore and engaged with the housing and the pin, wherein the free end of the second arm section is positioned away from the front wall and the free end of the first arm section is positioned proximate to the top wall when the spring is in an expanded condition, and wherein the free end of the second arm section is positioned proximate to the front wall and the free end of the first arm section is positioned away from the top wall when the spring is in a compressed condition.

2. The wearable electric field detector of claim 1, wherein a second pin and a second spring are provided, wherein the second pin is mounted within a second bore in the housing, the second spring being within the second bore and engaged with the housing and the second pin.

3. The wearable electric field detector of claim 1, wherein the first arm section has a pair of wings extending from opposite sides thereon, each wing forming an end surface which is spaced from the pivotal connection.

4. The wearable electric field detector of claim 3, further comprising first and second spaced apart projections extending from the top wall of the housing, the first and second projections forming a groove therebetween.

5. The wearable electric field detector of claim 4, further comprising a third projection extending from the top wall of the housing between the first arm section of the clip and a first side wall of the housing, the third projection having a ramped surface facing a rear end of the housing, and a fourth projection extending from the top wall of the housing between the first arm section of the clip and a second, opposite side wall of the housing, the fourth projection having a ramped surface facing the rear end of the housing.

6. The wearable electric field detector of claim 3, further comprising a first pair of spaced apart projections extending from the top wall of the housing between the first arm section of the clip and a first side wall of the housing, the first pair of spaced apart projections forming a first groove therebetween, and a second pair of spaced apart projections extending from the top wall of the housing between the first arm section of the clip and a second, opposite side wall of the housing, the second pair of spaced apart projections forming a second groove therebetween.

7. The wearable electric field detector of claim 6, further comprising a third projection extending from the top wall of the housing between the first arm section of the clip and the first side wall of the housing, the third projection having a ramped surface facing a rear end of the housing, and a fourth projection extending from the top wall of the housing between the first arm section of the clip and the second side wall of the housing, the fourth projection having a ramped surface facing the rear end of the housing.

8. The wearable electric field detector of claim 1, further comprising first and second spaced apart projections extending from the top wall of the housing, the first and second projections forming a groove therebetween.

9. The wearable electric field detector of claim 8, further comprising a third projection extending from the top wall of the housing between the first arm section of the clip and a first side wall of the housing, the third projection having a ramped surface facing a rear end of the housing, and a fourth projection extending from the top wall of the housing between the first arm section of the clip and a second, opposite side wall of the housing, the fourth projection having a ramped surface facing a rear end of the housing.

10. The wearable electric field detector of claim 1, further comprising a first pair of spaced apart projections extending from the top wall of the housing between the first arm section of the clip and a first side wall of the housing, the first pair of spaced apart projections forming a first groove therebetween, and a second pair of spaced apart projections extending from the top wall of the housing between the first arm section of the clip and a second, opposite side wall of the housing, the second pair of spaced apart projections forming a second groove therebetween.

11. The wearable electric field detector of claim 10, further comprising a third projection extending from the top wall of the housing between the first arm section of the clip and the first side wall of the housing, the third projection having a ramped surface facing a rear end of the housing, and a fourth projection extending from the top wall of the housing between the first arm section of the clip and the second side wall of the housing, the fourth projection having a ramped surface facing a rear end of the housing.

12. The wearable electric field detector of claim 1, further including an engagement region which is configured to be gripped by a wearer, wherein the engagement region is a recess in the first arm section extending from the free end thereof.

13. The wearable electric field detector of claim 1, further including an engagement region which is configured to be gripped by a wearer, wherein the engagement region is a wall extending from the second arm section at a front end of the first arm section.

14. The wearable electric field detector of claim 1, in combination with a hard hat.

15. The wearable electric field detector of claim 1, wherein multiple levels of audio alert are provided to the wearer to indicate a range of distances from the wearer to the detected electric field and/or a direction of the electric field relative to the wearer is indicated to the wearer by the indicator.

16. The wearable electric field detector of claim 1, wherein the indicator includes an audio indicator and/or a visual indicator.

17. The wearable electric field detector of claim 1, wherein the pivotal connection is provided proximate to the elbow.

18. The wearable electric field detector of claim 13, further including a second engagement region which is configured to be gripped by a wearer, wherein the second engagement region is a recess in the first arm section extending from the free end thereof.

19. A wearable electric field detector for detecting an electric field generated by a high-voltage electric source in an environment, the wearable electric field detector comprising:

a housing having a top wall, first side wall and a second opposite side wall, the housing providing a cavity in which electrical components are provided and a bore which is open to an outer surface of the housing;

an indicator operatively coupled to the electrical components and configured to provide an alert to a wearer indicative of a strength of a detected electric field;

a clip coupled to the housing by a pivotal connection, the clip including a first arm section which overlays a top wall of the housing, and a second arm section which overlays a front wall of the housing;

a first pair of spaced apart projections extending from the top wall of the housing between the first arm section of the clip and the first side wall of the housing, the first pair of spaced apart projections forming a first groove therebetween, and a second pair of spaced apart projections extending from the top wall of the housing between the first arm section of the clip and the second side wall of the housing, the second pair of spaced apart projections forming a second groove therebetween;

a pin mounted within a bore in the housing; and a spring within the bore and engaged with the housing and the pin, wherein the spring biases the pin outward from the housing and into contact with the second arm section of the clip.

20. A wearable electric field detector configured to detect an electric field generated by a high-voltage electric source in an environment, the wearable electric field detector comprising:

a housing providing a cavity in which electrical components are provided;

an indicator operatively coupled to the electrical components and configured to provide an alert to a wearer indicative of a strength of a detected electric field;

a clip coupled to the housing by a pivotal connection, the clip including a first arm section which overlays a top wall of the housing, a second arm section which overlays a front wall of the housing, and an engagement region provided by a wall extending from the second arm section at a front end of the first arm section which is configured to be gripped by a wearer;

a pin mounted within a bore in the housing; and a spring within the bore and engaged with the pin, wherein the spring biases the pin outward from the housing and into contact with the second arm section of the clip.

\* \* \* \* \*